United States Patent [19]

Anbe

[11] Patent Number: 5,042,421
[45] Date of Patent: Aug. 27, 1991

[54] ROTATABLE VACUUM CHUCK WITH MAGNETIC MEANS

[75] Inventor: Mitsue Anbe, Yokohama, Japan

[73] Assignee: Manhattan R&D, Inc., Yokohama, Japan

[21] Appl. No.: 557,578

[22] Filed: Jul. 24, 1990

[30] Foreign Application Priority Data

Jul. 25, 1989 [JP] Japan .................................. 1-102374
Jul. 25, 1989 [JP] Japan .................................. 1-192375

[51] Int. Cl.$^5$ ............................................ B05C 13/00
[52] U.S. Cl. ...................................... 118/52; 118/319; 118/500; 269/21; 269/276; 269/305
[58] Field of Search .................... 269/21, 57, 303, 305, 269/276, 315, 319; 118/52, 319, 50, 500

[56] References Cited

U.S. PATENT DOCUMENTS

| | | | |
|---|---|---|---|
| 3,990,689 | 11/1976 | Eklund | 269/21 |
| 4,086,870 | 5/1978 | Canavello et al. | 118/52 |
| 4,131,267 | 12/1978 | Ono et al. | 269/21 |
| 4,280,689 | 7/1981 | Frosch et al. | 118/52 |
| 4,504,045 | 3/1985 | Kenbo et al. | 269/21 |
| 4,711,610 | 12/1987 | Riehl | 409/141 |
| 4,790,262 | 12/1988 | Makayama et al. | 269/21 |
| 4,903,817 | 2/1990 | Summitsch | 269/21 |

Primary Examiner—Willard Hoag
Attorney, Agent, or Firm—Bierman and Muserlian

[57] ABSTRACT

A rotating head assembly of apparatus for applying a liquid photoresist solution to a semiconductor wafer includes a lower disk and an upper disk to be placed on the surface of the lower disk. On the surface of the lower disk, there are provided ribs for positioning the upper disk and the wafer so as to align the center thereof into the center of rotation. The height of the rib and the thickness of the upper disk are respectively the same as the thickness of the wafer. Magnetic means holds the upper and lower disk together.

10 Claims, 3 Drawing Sheets

ROTATABLE VACUUM CHUCK WITH MAGNETIC MEANS

BACKGROUND OF INVENTION

1. Field of Invention

The present invention relates generally to rotating head assemblies of apparatus for applying a liquid photoresist solution to a semiconductor wafer, and more particularly to rotating head assemblies of mounting a semiconductor wafer for applying a liquid photoresist solution thereto.

2. The State of Art

The processing of a semiconductor wafer to produce integrated circuit structures generally involves a series of steps in the course of which a layer of a liquid photoresist solution is formed covering the wafer surface.

Following the photoresist application step, on the coated surface of the wafer, a photomask plate is placed to form a pattern of a desired circuit. For the above purpose, the wafer must be coated by a uniform photoresist film or layer.

In the prior art, the application of the liquid photoresist solution to the surface of the wafer is carried out by using rotating apparatus to be referred to as a "spincoater". The wafer is mounted on a rotating disk of the spincoater, and is secured to the disk by suction of air by means of a vacuum pump, and the disk is rotated at the high speed in dropping the liquid photoresist solution on the surface of the wafer.

A coated film of the photoresist formed in the above manner, however, tends to increase in thickness at the periphery of each corner of a rectangular wafer by the action of centrifugal force, and a portion of the solution to be applied to the surface of the wafer is splashed from the wafer in the air.

According to the prior art, it is very difficult to align the center of the wafer into the axis of rotation of the disk.

OBJECTS OF THE INVENTION

In view of the foregoing, the main object of the present invention is to provide an improved rotating head assembly of apparatus for applying a liquid photoresist solution to a semiconductor wafer which is capable of applying the liquid photoresist solution to the surface of the wafer uniformly.

It is a further object of the present invention to provide a rotating head assembly on which the wafer can easily be placed on to align the center of the wafer into the axis of rotation of the assembly.

It is a still further object of the present invention is to provide a rotating head assembly by which portion of a liquid photoresist solution to be applied to the surface of the wafer is prevented from entering into a vacuum apparatus for securing the wafer to the assembly.

BRIEF DESCRIPTION OF THE DRAWINGS

These and other features and objectives of the present invention will be evident from the ensuing description and drawings, in which.

DESCRIPTION OF THE PREFERRED EMBODIMENTS

Figure 1:
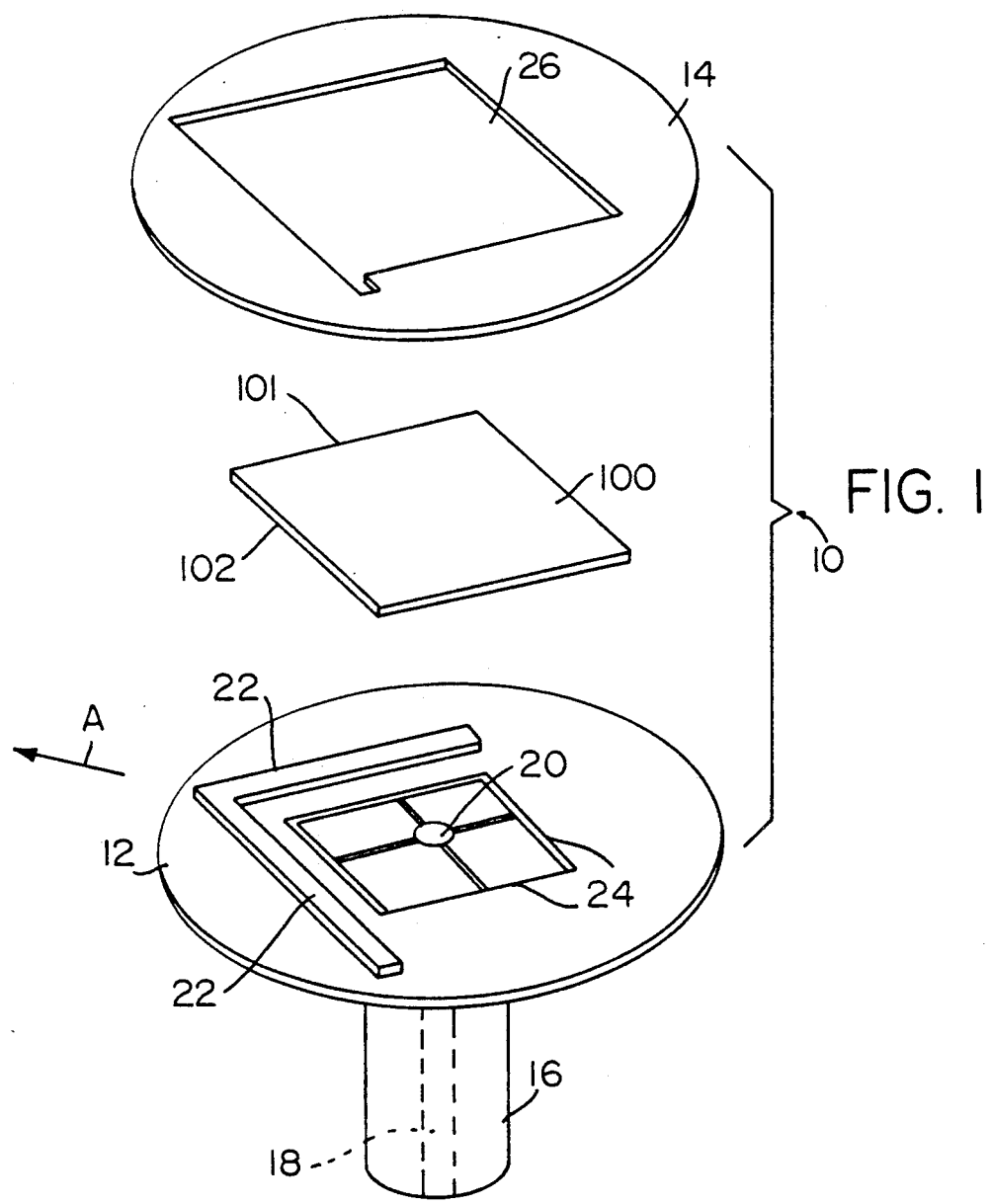
FIG. 1 is a schematic exploded perspective illustration of a rotating head assembly according to the present invention together with a wafer.

Referring now to FIG. 1, there is shown a principal rotating head assembly 10 of an apparatus for applying a liquid photoresist solution to the surface of a rectangular semiconductor wafer 100.

The head assembly 10 comprises a lower disk 12 and an upper disk 14 to be placed on the lower disk 12. The lower disk 12 has a rotating shaft 16 downwardly extended from the center of the backside of the lower disk 12 and can be rotated by suitable rotating mechanism of a spincoater. The rotating shaft 16 is provided with an air passage 18 extended along a longitudinal axis thereof and one end of the passage 18 is terminated at a central opening 20 formed in the lower disk 12 and other end is connected with a vacuum pump which is not shown in the drawing.

On the surface of the lower disk 12, there are provided two ribs 22 so as to intersect perpendicularly each other at one end of each of the ribs. The height of the rib 22 is substantially the same as the thickness of the wafer 100. The ribs 22 are arranged to align the center of the wafer 100 into the center of the lower disk 12 when the wafer 100 is placed on the lower disk 12 so as to contact the side edges 101 and 102 of the wafer 100 with the corresponding ribs 22.

The wafer 100 is fixedly secured to the surface of the lower disk 12 by the suction of air in operation of the vacuum pump. To this end, a plurality of grooves 24 which are respectively connected to the central opening 20 in the lower disk 12 are formed on the surface thereof.

The upper disk 14 to be placed on the surface of the lower disk 12 is formed to agree with the wafer 100 in thickness and has an opening 26 for receiving the wafer 100 together with the ribs 22.

According to the embodiment mentioned above, the center of the wafer 100 is completely aligned with the axis of the lower desk 12 when the upper disk is placed thereon and the wafer 100 is placed in the opening 26.

Consequently, when the solution is dropped on the surface of the wafer 100 in rotation of the head assembly 10, the solution can be uniformly overspread on the surface of the wafer by the action of centrifugal force. In order to keep from the solution on the surface of the upper disk 14, it may be coated or treated with synthetic resin.

Figure 2:
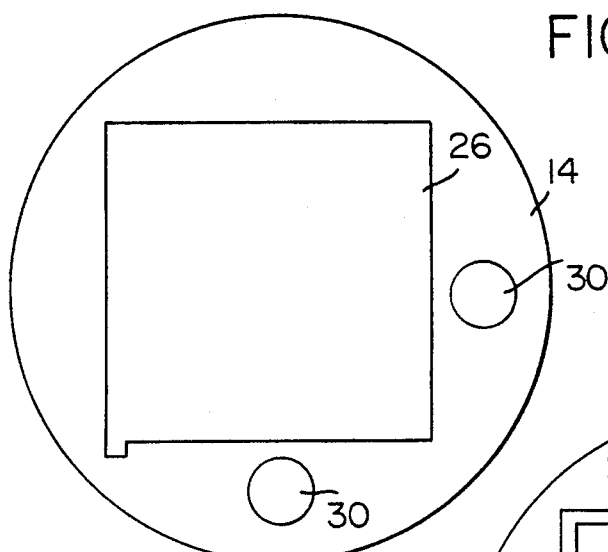
FIG. 2 is a top plan view of an upper disk.
Figure 3:
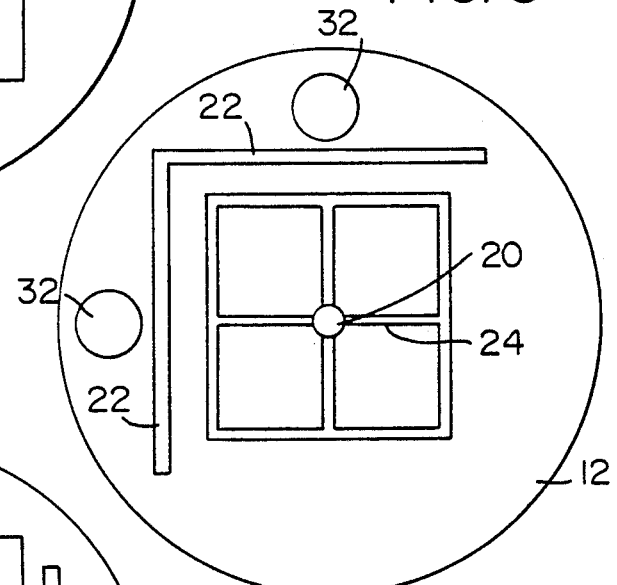
FIG. 3 is a top plan view of a lower disk.

According to the present invention, it is possible to press the wafer 100 placed on the lower disk 12 against the ribs 22, as shown in an arrow (A) in FIG. 1, by the side edges of the opening 26 in the upper disk 14 by the action of centrifugal force applied thereto. In order to increase the above effect, as shown in FIG. 2, in the side opposed to the ribs 22, the upper disk is provided with openings 30 for reducing the weight thereof. If desired, as shown in FIG. 3, in the side of the rib 22, the lower disk 12 is provided with recesses or hollow portions 32 so as to acquire balance in weight and maintain stability of the head assembly 10.

Figure 4A:
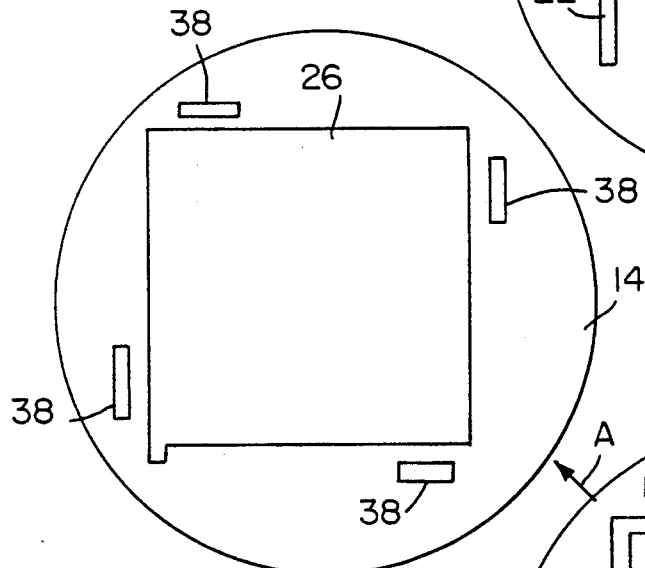
FIGS. 4 (a) and (b) are respectively a first modification of the upper disk and lower disk.
Figure 4B:
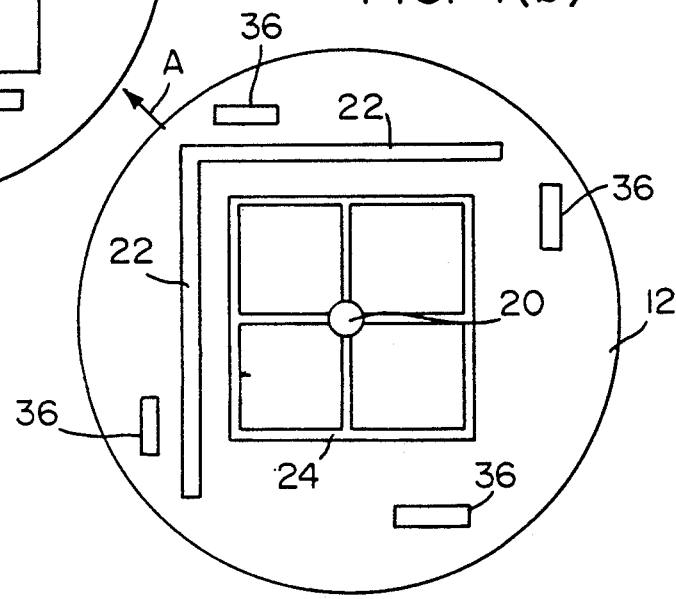
Figure 5:
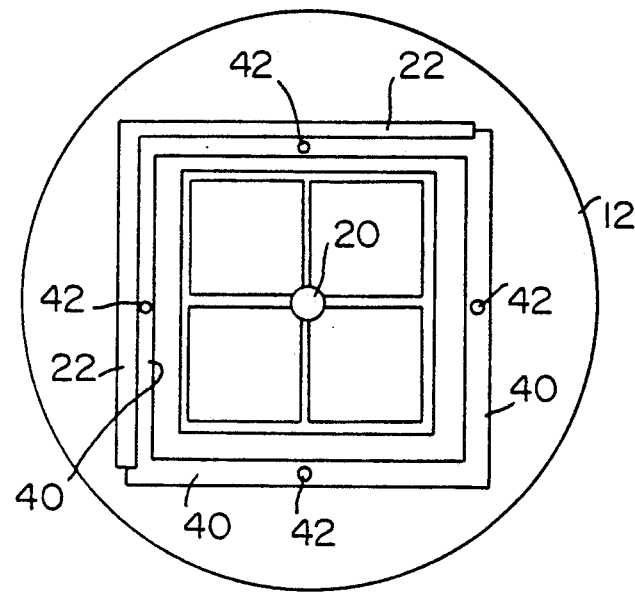
FIG. 5 is a top plan view of a second modification of the lower disk.

In the rotating head assembly 10 according to the present invention, as shown in FIG. 4 (b), there are provided magnets 36 in suitable positions of the lower disk 12 and members 38 of magnetic substance are arranged on the upper disk to cooperate with each other. Of course, it is possible to arrange the magnets to the upper disk 14 and the members 38 of magnetic substance to the lower disk 12 and, if desired, the member of magnetic substance can be replaced by the magnet.

To press the wafer 100 placed on the lower disk 12 positively against the ribs 22 by the action of the magnetic properties, the position of each of the magnets 36 and the member 38 of magnetic substance can be slightly shifted each other.

It is preferable to provide wide grooves 40 on the surface of the lower disk 12 along the peripheral edges of the wafer 100 to be placed thereon. The wide groove 40 can be provided with holes 42 for flowing out the solution entered into the wide groove passing through a space between the side edge of the upper disk 14 and the side edge of the wafer 100.

Figure 6:
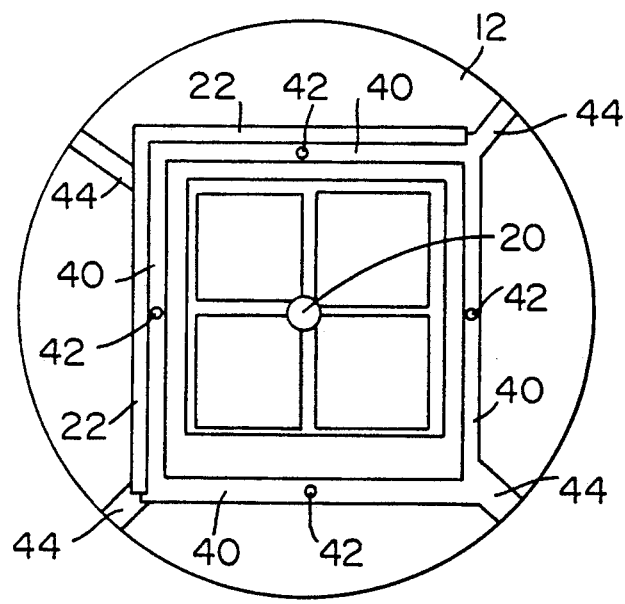
FIG. 6 is a top view of a third modification of the lower disk according to the present invention.

As shown in FIG. 6, each wide groove 40 can be connected with additional grooves 44 each of which is formed to extending to the side wall of the lower disk 12 so as to remove portion of the solution entered in groove 40 therefrom completely.

Obviously numerous modifications and variations of the present invention are possible in light of the above teachings. It is therefore to be understood that within the scope of the appended claims the invention may be practiced otherwise than as specifically described herein.

What is claimed is:

1. A rotatable head assembly of apparatus for applying a liquid photoresist solution to a semiconductor wafer comprising;
   a lower disk having a central opening therein and a rotatable shaft having a passage for connecting said central opening with a vacuum pump provided in said apparatus, and providing with ribs having the same height as the thickness of said wafer on the surface thereof, and
   an upper disk to be placed on said lower disk having the same thickness as one of said wafer and an opening for receiving said ribs and said wafer therein.

2. The rotatable head assembly as claimed in claim 1 in which the surface of said lower disk has a plurality of grooves connected with said central opening.

3. The rotatable head assembly as claimed in claim 1 in which said upper disk is provided with openings for reducing the weight of the disk opposed to said ribs.

4. The rotatable head assembly as claimed in claim 3 in which said lower disk is provided with hollow portions so as to reduce the weight in the side of said ribs.

5. The rotatable head assembly as claimed in claim 1 in which said lower disk is provided with a plurality of magnets and said upper disk is provided with a plurality of members of magnetic substance.

6. The rotatable head assembly as claimed in claim 5 or 6 in which the position of the magnet is slightly deviated from the position of said member of magnetic material.

7. The rotatable head assembly as claimed in claim 1 in which said upper disk is provided with a plurality of magnets and said lower disk is provided with a plurality of members of magnetic substance.

8. The rotating head assembly as claimed in claim 7 in which the position of the magnet is slightly deviated from the position of said member of magnetic material.

9. The rotatable head assembly as claimed in claim 1 in which said lower disk is provided with wide grooves in the position corresponding to the peripheral side edges of said wafer to be placed thereon, said grooves having holes penetrating the said lower disk.

10. The rotatable head assembly as claimed in claim 9 in which said wide grooves are connected with additional grooves extending to the side edge of said lower disk.

* * * * *